(12) United States Patent
Kim et al.

(10) Patent No.: US 8,084,934 B2
(45) Date of Patent: Dec. 27, 2011

(54) WHITE LIGHT EMITTING DEVICE

(75) Inventors: Byung-ki Kim, Gunpo-si (KR);
Kyung-sang Cho, Gwacheon-si (KR);
Eun-joo Jang, Daejeon-si (KR)

(73) Assignee: Samsung-Electro Mechanics Co., Ltd., Gyeonggi-do (KR)

( * ) Notice: Subject to any disclaimer, the term of this patent is extended or adjusted under 35 U.S.C. 154(b) by 533 days.

(21) Appl. No.: 11/355,005

(22) Filed: Feb. 16, 2006

(65) Prior Publication Data

US 2006/0244358 A1    Nov. 2, 2006

(30) Foreign Application Priority Data

May 2, 2005   (KR) .................. 10-2005-0036685

(51) Int. Cl.
*H05B 33/14* (2006.01)

(52) U.S. Cl. ........................... 313/501; 313/503

(58) Field of Classification Search .......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25; 252/301.4 R, 301.6 P, 301.4 P
See application file for complete search history.

(56) References Cited

U.S. PATENT DOCUMENTS

| | | | |
|---|---|---|---|
| 6,337,117 B1 * | 1/2002 | Maenosono et al. | 428/64.1 |
| 7,235,190 B1 * | 6/2007 | Wilcoxon et al. | 252/301.6 S |
| 2003/0227249 A1 * | 12/2003 | Mueller et al. | 313/491 |
| 2004/0145289 A1 * | 7/2004 | Ouderkirk et al. | 313/113 |
| 2004/0217692 A1 * | 11/2004 | Cho et al. | 313/503 |
| 2004/0245912 A1 * | 12/2004 | Thurk et al. | 313/484 |
| 2005/0212397 A1 * | 9/2005 | Murazaki et al. | 313/487 |
| 2006/0043337 A1 * | 3/2006 | Sakane et al. | 252/301.4 F |
| 2006/0066210 A1 * | 3/2006 | Ng et al. | 313/486 |
| 2006/0068154 A1 * | 3/2006 | Parce et al. | 428/76 |
| 2006/0083694 A1 * | 4/2006 | Kodas et al. | 424/46 |
| 2006/0222592 A1 * | 10/2006 | Burda | 424/9.6 |
| 2007/0024173 A1 * | 2/2007 | Braune | 313/485 |
| 2007/0290384 A1 * | 12/2007 | Kodas et al. | 264/5 |

FOREIGN PATENT DOCUMENTS

| | | |
|---|---|---|
| JP | 2000-049380 | 2/2000 |
| JP | 2002-510866 | 4/2002 |
| JP | 2004-015063 | 1/2004 |
| JP | 2004-071357 | 3/2004 |
| JP | 2004-228464 | 8/2004 |
| JP | 2006-108661 | 4/2006 |
| JP | 2006-114900 | 4/2006 |
| JP | 2006-114909 | 4/2006 |
| JP | 2008-521252 | 6/2008 |
| WO | WO 2004093203 A2 * | 10/2004 |

OTHER PUBLICATIONS

Japanese Office Action, with English translation, issued in Japanese Patent Application No. 2006-122612, mailed Jun. 21, 2011.

* cited by examiner

*Primary Examiner* — Nimeshkumar Patel
*Assistant Examiner* — Donald Raleigh
(74) *Attorney, Agent, or Firm* — McDermott Will & Emery LLP (57) ABSTRACT

A white LED with an improved structure for high light emitting efficiency is provided. The white LED includes a light source device and a phosphor containing light emitting nanoparticles and an inorganic phosphor which emit white light by being excited by the light source.

7 Claims, 6 Drawing Sheets

WHITE LIGHT EMITTING DEVICE

CROSS-REFERENCE TO RELATED PATENT APPLICATION

Priority is claimed to Korean Patent Application No. 10-2005-0036685, filed on May 2, 2005, in the Korean Intellectual Property Office, the disclosure of which is incorporated herein in its entirety by reference.

BACKGROUND OF THE INVENTION

1. Field of the Disclosure

The present disclosure relates to a white light emitting device (LED), and more particularly, to a white LED having an improved structure for higher light emission efficiency.

2. Description of the Related Art

As the light emitting efficiency of nitride semiconductor based blue and green light emitting devices (LEDs) and red LEDs using InGaAlP has increased, attempts to use such LEDs as lighting device beyond the current wide use for displays are expanding worldwide. LED light sources have superior characteristics to conventional light sources, i.e., very small size, 10% less power consumption, 10 times longer life time, 1000 times faster reaction speed compared to other light sources. Moreover, LED light sources are environment friendly in that they do not emit harmful rays such as ultraviolet rays and do not use mercury or other discharging gases. Since the adoption of the Kyoto Protocol for preventing global warming in December 1997, attempts to reduce the amount of $CO_2$ to 1990 levels by 2010 are spreading worldwide, and many countries, including Japan and the U.S.A., put forth much energy into the reduction of energy consumption. In this atmosphere, LEDs are becoming distinguished, next generation light sources and the LED-based lighting market is rapidly growing.

For use as general lighting sources, first of all, white light can be obtained using LEDs. Methods of implementing white LEDs are categorized into three types. First, white light can be obtained by combining three—red, green, and blue—LEDs. This method requires the three LEDs to produce one white light source, and techniques of controlling each of the LEDs. Second, white light can be obtained by exciting a yellow phosphor using a blue LED. This method provides high emitting efficiency but leads to a low color rendering index (CRI). CRI is likely to vary according to the current density, thus much research is required in order to obtain white light that is close to solar light. Third, white light can be obtained by exciting red, green, and blue phosphors using ultraviolet (UV) LED. This method can be used in a high current condition and provides the color gamut of high quality. Therefore, this method has been most actively researched and developed. As described, to implement such a white LED, the three principle color phosphors composed of conventional inorganic phosphors can be used. However, such inorganic phosphors, especially red inorganic phosphor has low light emission efficiency, thus obstructing the implementation of highly efficient, high light emission, white LEDs.

SUMMARY OF THE DISCLOSURE

To solve the above-described problems, the present disclosure provides a white light emitting device (LED) with an improved structure for high light emitting efficiency.

According to an aspect of the present disclosure, there is provided a white LED comprising: a light source device; and a phosphor containing light emitting nanoparticles and an inorganic phosphor and which emit white light near the light source device by being excited by the light source.

The light emitting nanoparticles may include at least one selected from the group consisting of red, green, and blue light emitting nanoparticles, and the inorganic phosphor may include at least one selected from the group consisting of red, green, and blue inorganic phosphors.

The light emitting nanoparticles refer to semiconductor particles (quantum dots) with a quantum confinement effect, wherein the diameter of the quantum dots is in a range of 1-10 nm, and light having a desired wavelength can be emitted by controlling the size of the quantum dots.

In other words, due to the quantum size effect, light of different wavelengths, i.e., various colors, including red, green, and blue, can be easily obtained. LEDs emitting light of different colors can be manufactured, and white light or light of various colors can be realized by combining quantum dots (QDs) which emit various colors.

The quantum dots can be synthesized using a chemical wet process. In the chemical wet process, which is already publicly known, precursors are dissolved into an organic solvent, and quantum dots are grown from the precursors. Examples of materials for the quantum dots include Group II-VI compounds, such as CdSe, CdTe, CdS, ZnSe, ZnTe, ZnS, HgTe, HgS, etc.

In addition, the quantum dots may have a core-shell structure. The core may contain one material selected from the group consisting of CdSe, CdTe, CdS, ZnSe, ZnTe, ZnS, HgTe, and HgS. The shell may contain one material selected from the group consisting of CdSe, CdTe, CdS, ZnSe, ZnTe, ZnS, HgTe, and HgS. Group III-V compounds, such as InP, etc. can be used for the quantum dots. The content of the light emitting nanoparticles may be controlled such that the UV light absorption by the light emitting nanoparticles is 50% or less.

Any red, green, and blue inorganic phosphors, which are widely known, can be used in the present disclosure without limitation. The red inorganic phosphor used in the present disclosure may include at least one selected from the group consisting of $(Sr,Ca,Ba,Mg)P_2O_7:Eu^{2+},Mn^{2+}$; $CaLa_2S_4:Ce^{3+}$; $SrY_2S_4:Eu^{2+}$; $(Ca,Sr)S:Eu^{2+}$; $SrS:Eu^{2+}$; $Y_2O_3:Eu^{3+},Bi^{3+}$; $YVO_4:Eu^{3+},Bi^{3+}$; $Y_2O_2S:Eu^{3+},Bi^{3+}$; $Y_2O_2S:Eu^{3+}$. The green inorganic phosphor may include at least one selected from the group consisting of $YBO_3:Ce^{3+},Tb^{3+}$; $BaMgAl_{10}O_{17}:Eu^{2+},Mn^{2+}$; $(Sr,Ca,Ba)(Al,Ga)_2S_4:Eu^{2+}$; $ZnS:Cu,Al$; $Ca_8Mg(SiO_4)_4Cl_2:Eu^{2+}$, $Mn^{2+}$; $Ba_2SiO_4:Eu^{2+}$; $(Ba,Sr)_2SiO_4:Eu^{2+}$; $Ba_2(Mg, Zn)Si_2O_7:Eu^{2+}$; $(Ba,Sr)Al_2O_4:Eu^{2+}$; and $Sr_2Si_3O_8\cdot2SrCl_2:Eu^{2+}$. The blue inorganic phosphor may include at least one selected from the group consisting of $(Sr,Mg,Ca)_{10}(PO_4)_6Cl_2:Eu^{2+}$; $BaMgAl_{10}O_{17}:Eu^{2+}$; and $BaMg_2Al_{16}O_{27}:Eu^{2+}$.

The wavelength of the light source may be in a range of from 360 nm to 440 nm. A GaN-based light emitting device may be used as the light source device.

According to another aspect of the present disclosure, there is provided a light source device; and a phosphor including light emitting nanoparticles and inorganic phosphors which emits a white light by being excited by the light source, wherein the phosphor includes a first phosphor layer formed on the light source device and containing at least one of red light emitting nanoparticles and a red inorganic phosphor, a second phosphor layer formed on the first phosphor layer and containing at least one of green light emitting nanoparticles and a green inorganic phosphor, and a third phosphor layer formed on the second phosphor layer and containing at least one of blue light emitting nanoparticles and a blue inorganic phosphor.

According to another aspect of the present disclosure, there is provided a white LED comprising: a light source device; and a phosphor containing light emitting nanoparticles and an inorganic phosphor that emit a white light by being excited by the light source, wherein the phosphor includes a first phosphor layer formed on the light source device and containing at least one of red light emitting nanoparticles and a red inorganic phosphor; and a fourth phosphor layer formed on the first phosphor layer and containing at least one of green light emitting nanoparticles and a green inorganic phosphor and at least one of blue light emitting nanoparticles and a blue inorganic phosphor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Hereinafter embodiments of a white light emitting device (LED) will be described with reference to the appended drawings. In the drawings, the thicknesses of layers and regions are exaggerated for clarity.

Figure 1:
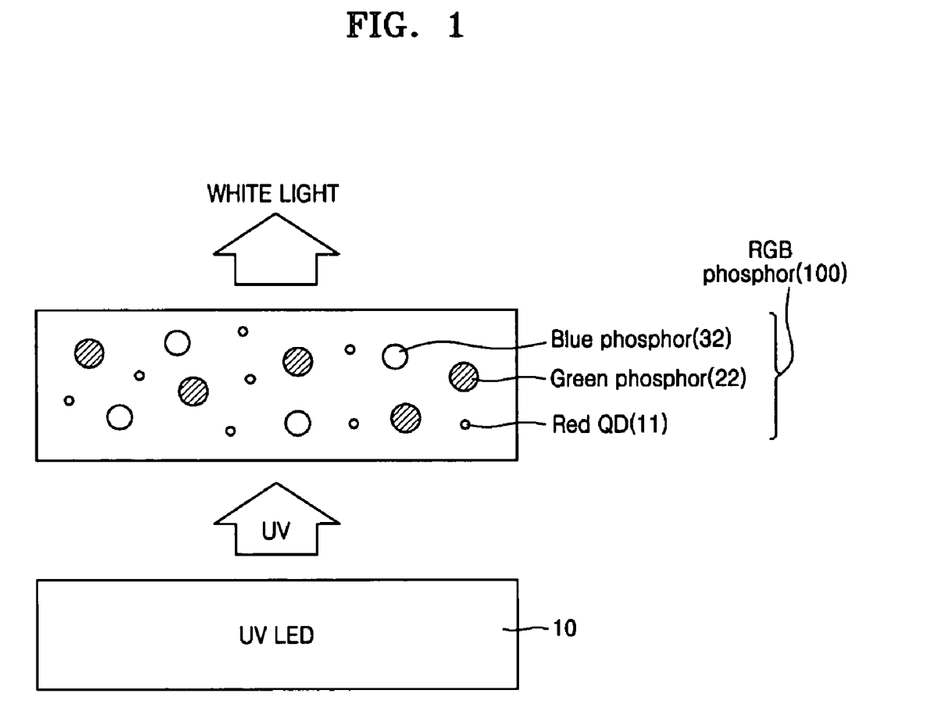
FIG. 1 is a schematic cross-sectional view of a white LED according to a first embodiment of the present invention.

FIG. 1 is a schematic cross-sectional view of a white LED according to an embodiment. Referring to FIG. 1, the white LED includes a light source device 10 and a phosphor 100 formed on the light source device 10.

The light source device 10 emits UV light having a wavelength range from 360 nm to 440 nm or blue light to excite the phosphor 100. For example, the light source device may be a UV LED.

As the functions, types and structures of UV LEDs are commonly known, detailed descriptions and illustration thereof will be omitted. In particular, GaN-based light emitting device can be used as the UV LED. In general, the GaN-based light emitting device includes an n-GaN layer, an active layer, a p-GaN layer, and a p-electrode, which are sequentially stacked on a sapphire ($Al_2O_3$) substrate. An n-electrode is provided on the n-GaN layer to correspond to the p-electrode. The active layer includes a quantum well layer and barrier layers formed on and underneath the quantum well layer. Examples of the active layer include AlGaN/GaN/AlGaN layer, InAlGaN/InAlGaN/InAlGaN layer, and AlGaN/InGaN/AlGaN layer. The active layers may have either a multiple-quantum well structure or single quantum well structure.

The phosphor 100 emits white light by being excited by the light source 10. In the specification, the term "phosphor" refers to a combination of the phosphors of the three principle colors, i.e., red, green, and blue, which can emit white light.

In the white LED according to the present disclosure, the phosphor 100 is a combination of light emitting nanoparticles and inorganic phosphor in a proper ratio that can emit white light. The light emitting nanoparticles include at least one selected from the group consisting of red light emitting particles, green light emitting particles, and blue light emitting particles. The inorganic phosphor includes at least one selected from the group consisting of red inorganic phosphor, green inorganic phosphor, and blue inorganic phosphor.

The light emitting nanoparticles refers to particles of certain sizes having a quantum confinement effect, such as quantum dots (QD). The diameter of such a quantum dot is in the range from 1 nm to 10 nm. The quantum dot can be synthesized using a chemical wet process. In the chemical wet process, which is already publicly known, precursors are dissolved into an organic solvent, and quantum dots are grown from the precursors. Examples of materials for the quantum dots include CdSe, CdTe, CdS, ZnSe, ZnTe, ZnS, HgTe, HgS, etc. In addition, the quantum dots may have a core-shell structure. The core may contain one material selected from the group consisting of CdSe, CdTe, CdS, ZnSe, ZnTe, ZnS, HgTe, and HgS. The shell may contain one material selected from the group consisting of CdSe, CdTe, CdS, ZnSe, ZnTe, ZnS, HgTe, and HgS.

Due to the quantum size effect, light of different wavelengths, i.e., seven different colors of the rainbow, including red, green, and blue, can be easily obtained. LEDs emitting light of different colors can be manufactured, and white light or light of various colors can be realized by combining quantum dots (QDs) of different sizes. In particular, it is known that such quantum dots have excellent light emitting characteristics. It is also known that inorganic phosphors have low light emitting efficiency. However, when inorganic phosphors are substituted by or used together with light emitting nanoparticles, a white LED with improved light emitting characteristics can be manufactured.

Therefore, the phosphor 100 can be produced by appropriately mixing the light emitting nanoparticles and the inorganic phosphors as described above. The phosphor 100 can be coated on the light source device 10 using various methods, such as spin coating, deep coating, printing, spray coating, etc. The phosphor 100 may be formed with a multi-layered structure. In FIG. 1, the phosphor 100 includes red light emitting quantum dots 11, a green inorganic phosphor 22, and a blue inorganic phosphor 32. Quantum dots with a CdSe/CdS core/shell structure is used as the red light emitting quantum dots 11, and $BaMgAl_{10}O_{17}:Eu^{2+},Mn^{2+}$ is used as the green inorganic phosphor 22, and $Sr_5(PO_4)_3Cl:Eu$ as the blue inorganic phosphor 32. In particular, it is known that such red light emitting quantum dots have high light emitting efficiency. When the red light emitting quantum dots 11, instead of conventional red inorganic phosphor, which is known to have low light efficiency, are used together with red inorganic phosphor, the light emitting characteristics of the white LED are improved. However, when a large amount of the light emitting nanoparticles, that is, the quantum dots, is contained in the phosphor 100, self-absorption by the quantum dots may occur. Self-absorption indicates the reabsorption of the visible light generated from the quantum dots and inorganic phosphors that absorbed UV light, i.e., red, green, and blue light, into the quantum dots.

Such self-absorption may drop light emitting efficiency of the white LED. Therefore, the content of the quantum dots in the phosphor 100 must be optimized to increase the light emitting efficiency of the white LED. The content of the quantum dots may be controlled such that the UV light absorption by the quantum dots is 50% or less. A white LED according to the present disclosure described above includes phosphor containing light emitting nanoparticles with high light emitting efficiency together with inorganic phosphor, and thus has high light emitting efficiency.

Figure 2:
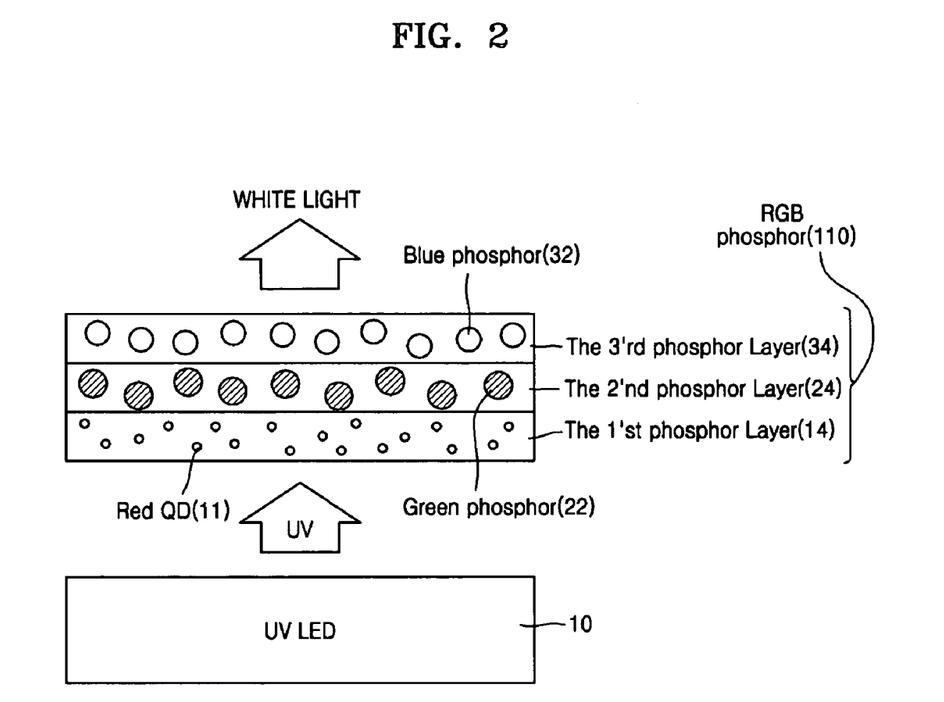
FIG. 2 is a schematic cross-sectional view of a white LED according to second embodiment of the present invention.

FIG. 2 is a schematic cross-sectional view of a white LED according to a second embodiment of the present disclosure. Like reference numerals in the drawings denote like elements, and thus their description will be omitted.

In the second embodiment, a phosphor 110 has a multi-layered structure, and includes a first phosphor layer 14, a second phosphor layer 24, and a third phosphor layer 34 sequentially formed on the UV light emitting device 10. The first phosphor layer 14 includes at least one of red light emitting nanoparticles and red inorganic phosphors. The second phosphor layer 24 includes at least one of green light emitting nanoparticles and green inorganic phosphors. The third phosphor 34 includes at least one of blue light emitting nanoparticles and blue inorganic phosphors.

In particular, referring to FIG. 2, the first phosphor layer 14 includes red light emitting quantum dots 11, the second phosphor layer 24 includes a green inorganic phosphor 22, and the third phosphor layer 34 includes a blue inorganic phosphor 32. As described above, using phosphor including light emitting particles with high light emitting efficiency together with inorganic phosphor, a white LED with high light emitting efficiency can be obtained. In particular, in the white LED with the multi-layered structure according to the second embodiment, residual UV light that is not absorbed by the red light emitting quantum dots 11 of the first phosphor layer 14 can be absorbed by the green inorganic phosphor 22 of the second phosphor layer 24 and the blue inorganic phosphors 32 of the third phosphor layer 34, and thus UV light utilization efficiency can be enhanced.

As an additional effect, a portion of the visible light generated from the green inorganic phosphor 22 and the blue inorganic phosphor 32 is not emitted out of the phosphor 110 and travels the inside, i.e., toward the UV light emitting device 10. The portion of light entering the UV light emitting device 10 is absorbed by the red light emitting quantum dots 11 and can be used as a light source to excite the red light emitting quantum dots 11, thus improving the light utilization. According to the present disclosure having such a structure described above, the UV utilization efficiency and the light utilization efficiency are improved, so that the light emitting efficiency of a white LED can be improved.

Figure 3:
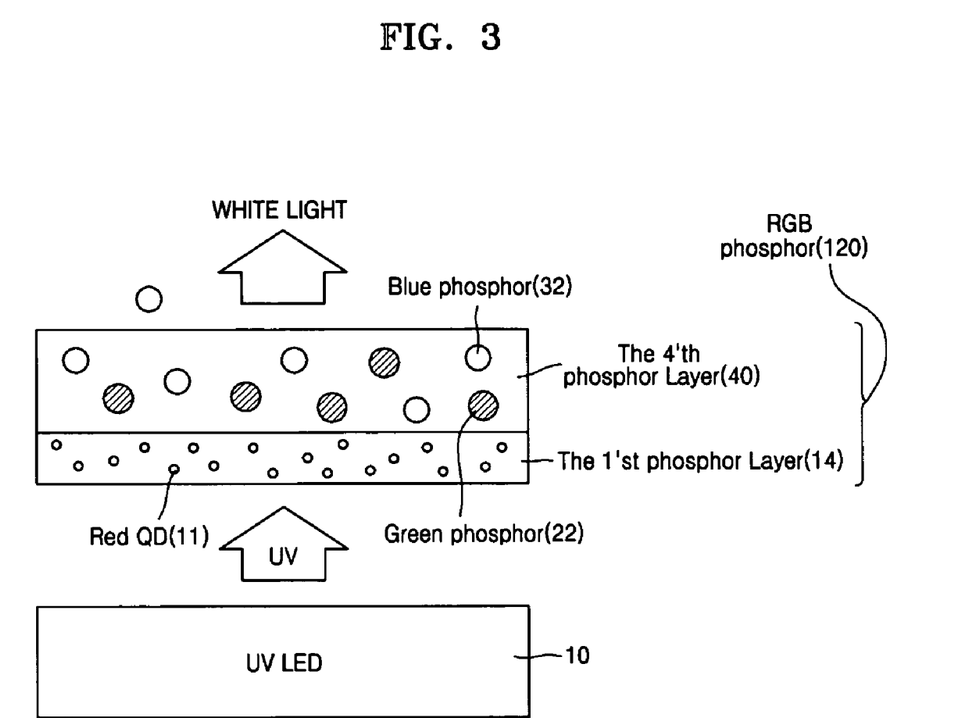
FIG. 3 is a schematic cross-sectional view of a white LED according to third embodiment of the present invention.

FIG. 3 is a schematic cross-sectional view of a white LED according to a third embodiment of the present disclosure. Like reference numerals in the drawings denote like elements and thus their description will be omitted.

According to the third embodiment, a phosphor 120 has a multi-layered structure and includes a first phosphor layer 14 and a fourth phosphor layer 40, which are sequentially formed on the UV LED 10. The first phosphor layer 140 includes at least one of red light emitting nanoparticles and red inorganic phosphor, and the fourth phosphor layer 40 includes at least one of blue light emitting nanoparticles and blue inorganic phosphor. In particular, referring to FIG. 3, the first phosphor layer 14 includes red light emitting quantum dots 11, and the fourth phosphor layer 40 include a green inorganic phosphors 22 and a blue inorganic phosphor 32. As described above, using a phosphor including light emitting particles with high light emitting efficiency together with inorganic phosphor, a white LED with high light emitting efficiency can be obtained.

In particular, residual UV light of a white LED with a multi-layered structure of the third embodiment, which is not absorbed by the red light emitting quantum dots 11 of the first phosphor layer 14, can be absorbed by the green inorganic phosphor 22 of the fourth phosphor layer 40 and the blue inorganic phosphors 32, and thus improving UV light utilization efficiency. Additionally, a portion of the visible light generated from the green inorganic phosphor 22 and the blue inorganic phosphor 32, which have absorbed UV light is not emitted out of the phosphor 110 and travels inside the UV light emitting device 10, i.e., toward the UV light emitting device 10. The portion of light entering the UV light emitting device 10 is absorbed by the red light emitting quantum dots 11 and can be used as a light source to excite the red light emitting quantum dots 11, thus improving the light utilization efficiency.

Figure 4:
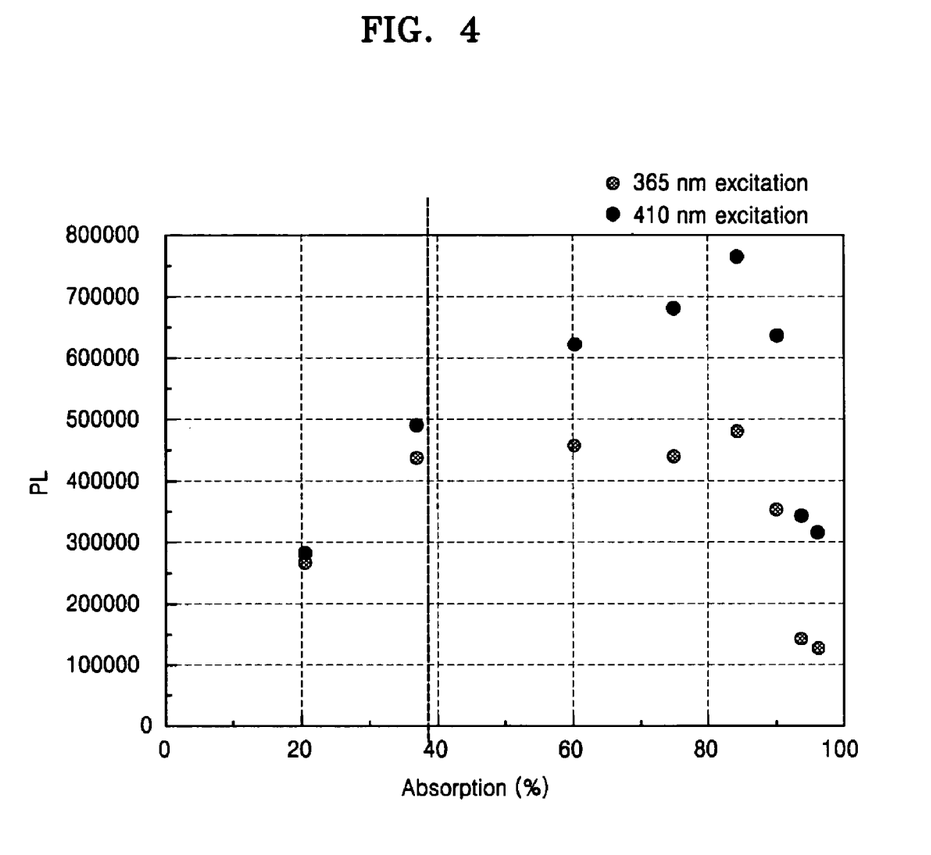
FIG. 4 is a graph illustrating the photoluminescence of light emitting nanoparticles with respect to UV light absorption.

FIG. 4 is a graph illustrating the photoluminescence of the nanoparticles with respect to UV light absorption.

In the graph of FIG. 4, the photoluminescence of the quantum dots with respect to UV light absorption linearly increases up to 50%, but the rate of increase decreases at an absorption greater than 50%. This is attributed due to self-absorption by the quantum dots. Therefore, the content of the quantum dots in the phosphor has to be controlled such that the UV light absorption is to be less than 50%.

Figure 5A:
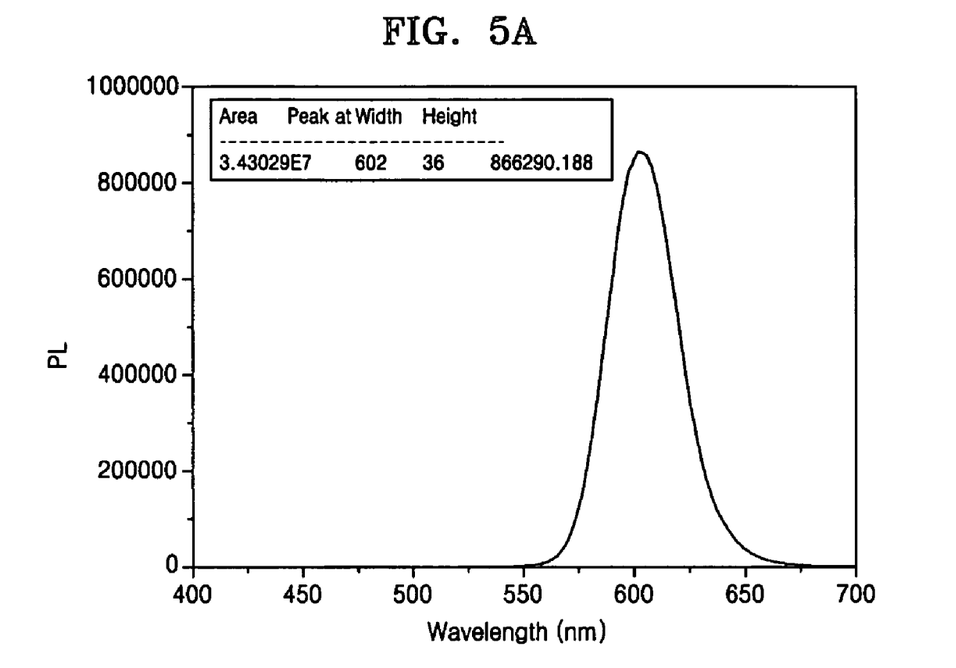
FIG. 5A through FIG. 5C are graphs illustrating the photoluminescences of red light emitting nanoparticles, green inorganic phosphors, and blue inorganic phosphors, respectively.
Figure 5B:
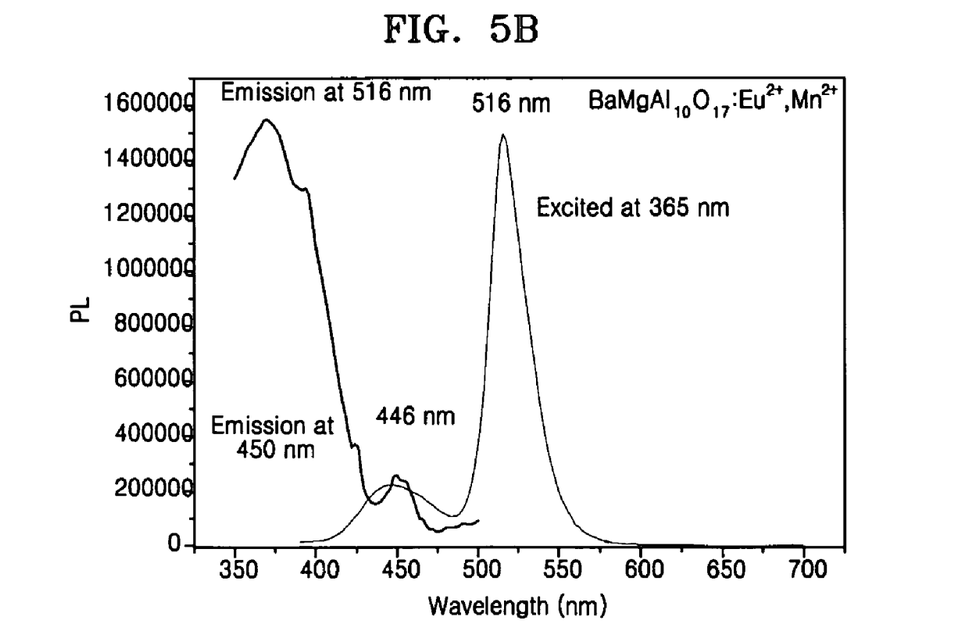
Figure 5C:
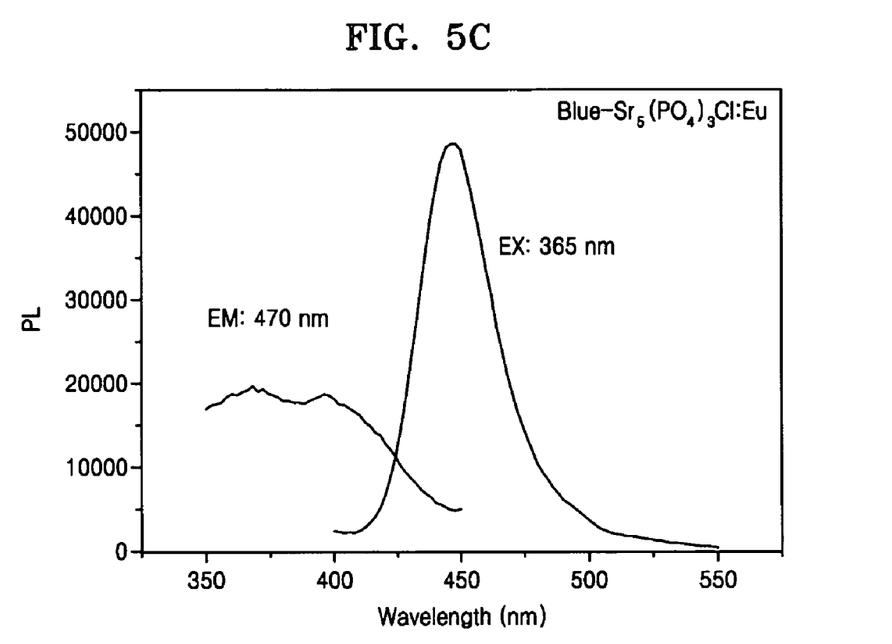

FIG. 5A through FIG. 5C are graphs of the photoluminescences of red light emitting nanoparticles, green inorganic phosphor, and blue inorganic phosphor, respectively.

Figure 6:
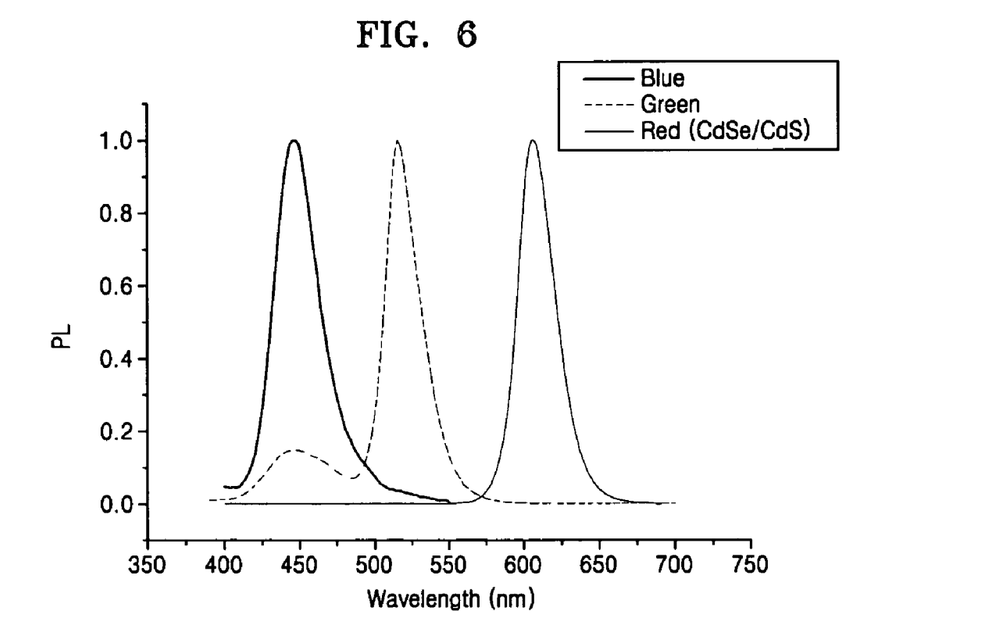
FIG. 6 is a graph illustrating the photoluminescence of a white LED according to the present disclosure.

FIG. 6 is a graph of the photoluminescence of a white LED according to the present disclosure. The white LED with the structure according to the present disclosure provides high light emitting efficiency by using a phosphor including light emitting nanoparticles with high light emitting efficiency together with inorganic phosphor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white LED comprising:
 a light source device; and
 a phosphor containing light emitting nanoparticles exhibiting a quantum confinement effect and an inorganic phosphor that emit a white light by being excited by the light source,
 wherein the phosphor includes a first phosphor layer formed on the light source device and containing red light emitting nanoparticles, and a fourth phosphor layer formed on the first phosphor layer and containing at least one of green light emitting nanoparticles and a green inorganic phosphor and at least one of blue light emitting nanoparticles and a blue inorganic phosphor, and
 wherein a light absorption by the light emitting nanoparticles is 50% or less.

2. The white LED of claim 1, wherein the nanoparticles are formed of Group II-VI semiconductor compound quantum dots or Group III-V semiconductor quantum dots.

3. The white LED of claim 1, wherein
 the green inorganic phosphor is at least one selected from the group consisting of $YBO_3$: $Ce^{3+},Tb^{3+}$;

$BaMgAl_{10}O_{17}:Eu^{2+}, Mn^{2+}$; $(Sr,Ca,Ba)(Al,Ga)_2S_4:Eu^{2+}$; $ZnS:Cu,Al$; $Ca_8Mg(SiO_4)_4Cl_2: Eu^{2+}, Mn^{2+}$; $Ba_2SiO_4:Eu^{2+}$; $(Ba,Sr)_2SiO_4: Eu^{2+}$; $Ba_2(Mg, Zn)Si_2O_7:Eu^{2+}$; $(Ba,Sr)Al_2O_4:Eu^{2+}$; and $Sr_2Si_3O_8 \cdot 2SrCl_2:Eu^{2+}$, and the blue inorganic phosphor is at least one selected from the group consisting of $(Sr,Mg,Ca)_{10}(PO_4)_6Cl_2:Eu^{2+}$; $BaMgAl_{10}O_{17}:Eu^{2+}$; and $BaMg_2Al_{16}O_{27}:Eu^{2+}$.

4. The white LED of claim 1, wherein the wavelength of the light source is in the range of from 360 nm to 440 nm.

5. The white LED of claim 1, wherein the light source device is a GaN-based light emitting device.

6. The white LED of claim 1, wherein the first phosphor layer further comprises a red inorganic phosphor.

7. The white LED of claim 1, wherein the light absorption is UV light absorption.

* * * * *